(12) United States Patent
Duan et al.

(10) Patent No.: US 11,695,383 B2
(45) Date of Patent: Jul. 4, 2023

(54) TERMINATION CIRCUITS AND ATTENUATION METHODS THEREOF

(71) Applicant: MARVELL ASIA PTE, LTD., Singapore (SG)

(72) Inventors: Yida Duan, Mountain View, CA (US); Karthik Raviprakash, Santa Jose, CA (US); Parmanand Mishra, Cupertino, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 163 days.

(21) Appl. No.: 17/037,110

(22) Filed: Sep. 29, 2020

(65) Prior Publication Data

US 2022/0103149 A1    Mar. 31, 2022

(51) Int. Cl.
| | |
|---|---|
| H03H 7/40 | (2006.01) |
| H03F 1/56 | (2006.01) |
| H03H 7/38 | (2006.01) |
| H04B 1/16 | (2006.01) |
| H04B 1/18 | (2006.01) |
| H04L 25/02 | (2006.01) |

(52) U.S. Cl.
CPC ............. *H03H 7/40* (2013.01); *H03F 1/565* (2013.01); *H03H 7/383* (2013.01); *H04B 1/16* (2013.01); *H04B 1/18* (2013.01); *H04L 25/0298* (2013.01); *H03H 2007/386* (2013.01)

(58) Field of Classification Search
CPC .... H03H 7/40; H03H 7/383; H03H 2007/386; H03H 7/09; H03H 7/25; H03H 7/38; H03F 1/565; H04B 1/16; H04B 1/18; H04L 25/0298
See application file for complete search history.

(56) References Cited

U.S. PATENT DOCUMENTS

| | | | | |
|---|---|---|---|---|
| 6,965,655 B1* | 11/2005 | Mostov | ................... | H03G 11/00 375/345 |
| 10,284,394 B1* | 5/2019 | Forey | ................... | H04L 25/0292 |
| 2005/0070325 A1* | 3/2005 | Bellaouar | ................. | H04B 1/30 455/313 |
| 2006/0055579 A1* | 3/2006 | Fontaine | ................... | H03M 3/36 341/155 |
| 2014/0016683 A1* | 1/2014 | Jiang | ......................... | H03H 7/38 375/220 |
| 2018/0083584 A1* | 3/2018 | Yuan | ..................... | H03G 1/0023 |

* cited by examiner

*Primary Examiner* — Yuwen Pan
*Assistant Examiner* — Fatuma G Sherif

(57) ABSTRACT

The present invention is directed to communication systems and electrical circuits. According to an embodiment, the present invention provides a termination circuit that includes an inductor network. The inductor network is coupled to a termination resistor and a capacitor network, which includes a first capacitor and a second capacitor. The termination resistor, the first capacitor, and the second capacitor are adjustable, and they affect attenuation of the termination circuit. There are other embodiments as well.

15 Claims, 4 Drawing Sheets

TERMINATION CIRCUITS AND ATTENUATION METHODS THEREOF

CROSS-REFERENCES TO RELATED APPLICATIONS

Not Applicable

STATEMENT AS TO RIGHTS TO INVENTIONS MADE UNDER FEDERALLY SPONSORED RESEARCH AND DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to communication systems and electrical circuits.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily.

In high speed communication applications, an important aspect is to process received signals at the receivers. Among other components, input terminals of receivers are specifically configured to receive and process incoming signals. Over the past, various types of conventional input termination circuits have been used, but they have been inadequate. Therefore, improved systems and methods thereof are desired.

BRIEF SUMMARY OF THE INVENTION

The present invention is directed to communication systems and electrical circuits. According to an embodiment, the present invention provides a termination circuit that includes an inductor network. The inductor network is coupled to a termination resistor and a capacitor network, which includes a first capacitor and a second capacitor. The termination resistor, the first capacitor, and the second capacitor are adjustable, and they affect attenuation of the termination circuit. There are other embodiments as well.

According to an embodiment, the present invention provides a receiver device, which includes a termination circuit that has an inductor network and a capacitor network. The inductor network is coupled to an input terminal. The capacitor network is coupled to the inductor network and an intermediate output terminal. The capacitor network includes a first variable capacitor and a second variable capacitor. A first capacitance of the first variable capacitor is based on a first control signal. A second capacitance of the second variable capacitor is based on a second control signal. The termination circuit is configured to generate an intermediate signal characterized by a first attenuation factor. The first attenuation factor is based on at least the first capacitance and the second capacitance. The receiver device also includes an equalizer configured to generate an equalized signal using the intermediate signal. The receiver device further includes an amplifier configured to generate an amplifier signal using the equalized signal. The receiver device also includes an analog-to-digital converter (ADC) configured to generate at least a digital control signal. The receiver device also includes a control module configured to generate at least the first control signal and the second control signal associated with the digital control signal.

According to another embodiment, the present invention provides a termination circuit, which includes an input terminal for receiving an input signal. The termination circuit also includes an inductor network comprising a first inductor coupled to the second inductor via a first node. The termination circuit also includes a variable resistor coupled to the second inductor. The variable resistor is coupled to a first control signal. The first control signal is associated with an attenuation factor. The termination circuit also includes a capacitor network coupled to the first node. The capacitor includes a first variable capacitor coupled to a second variable capacitor via a second node. The first variable capacitor is coupled to a second control signal. The second variable capacitor is coupled to a third control signal. The second control signal and the third control signal are associated with the attenuation factor. The termination circuit also includes a third capacitor coupled to the second node. The termination circuit also includes an output terminal providing an output signal, the output signal being a function of the input signal and the attenuation factor.

According to yet another embodiment, the present invention provides a method for operating a termination circuit, which has a capacitor network and an inductor network and resistor. The method includes receiving an input signal. The method also includes obtaining an input resistance value. The method further includes providing an attenuation value. The method further includes generating a first control signal and a second control signal based at least on the attenuation value and input resistance value. The method also includes adjusting a first capacitance of the capacitor network using the first control signal. The method further includes adjusting a resistance of a variable resistor using the second control signal. The variable resistor is coupled to the inductor network. The method also includes generating an output signal. The output signal is a function of the input signal and the attenuation value.

It is to be appreciated that embodiments of the present invention provide many advantages over conventional techniques. Among other things, a termination circuit according to embodiments of the present invention provides extended bandwidth and attenuation adjustability. More specifically, T-coils as implemented in termination circuits can significantly improve signal bandwidth. Variable capacitors and resistors, receiving control signals from a control module, provide the desired attenuation and maintain the matching provided by the termination network without affecting bandwidth and matching functionalities of T-coils.

Embodiments of the present invention can be implemented in conjunction with existing systems and processes. For example, termination circuits according to the present invention can be manufactured using existing manufacturing techniques and processes. In various embodiments, termination circuits according to the present invention are characterized by both small circuit area and low power consumption. Additionally, termination circuits according to the present invention can be incorporated into existing systems and devices. For example, termination circuits can be incorporated into data communication modules, receiver devices, serializer/deserializer (SerDes) devices, and others. In certain embodiments, termination circuits are implemented as components of analog front end (AFE) sections of receiver devices. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
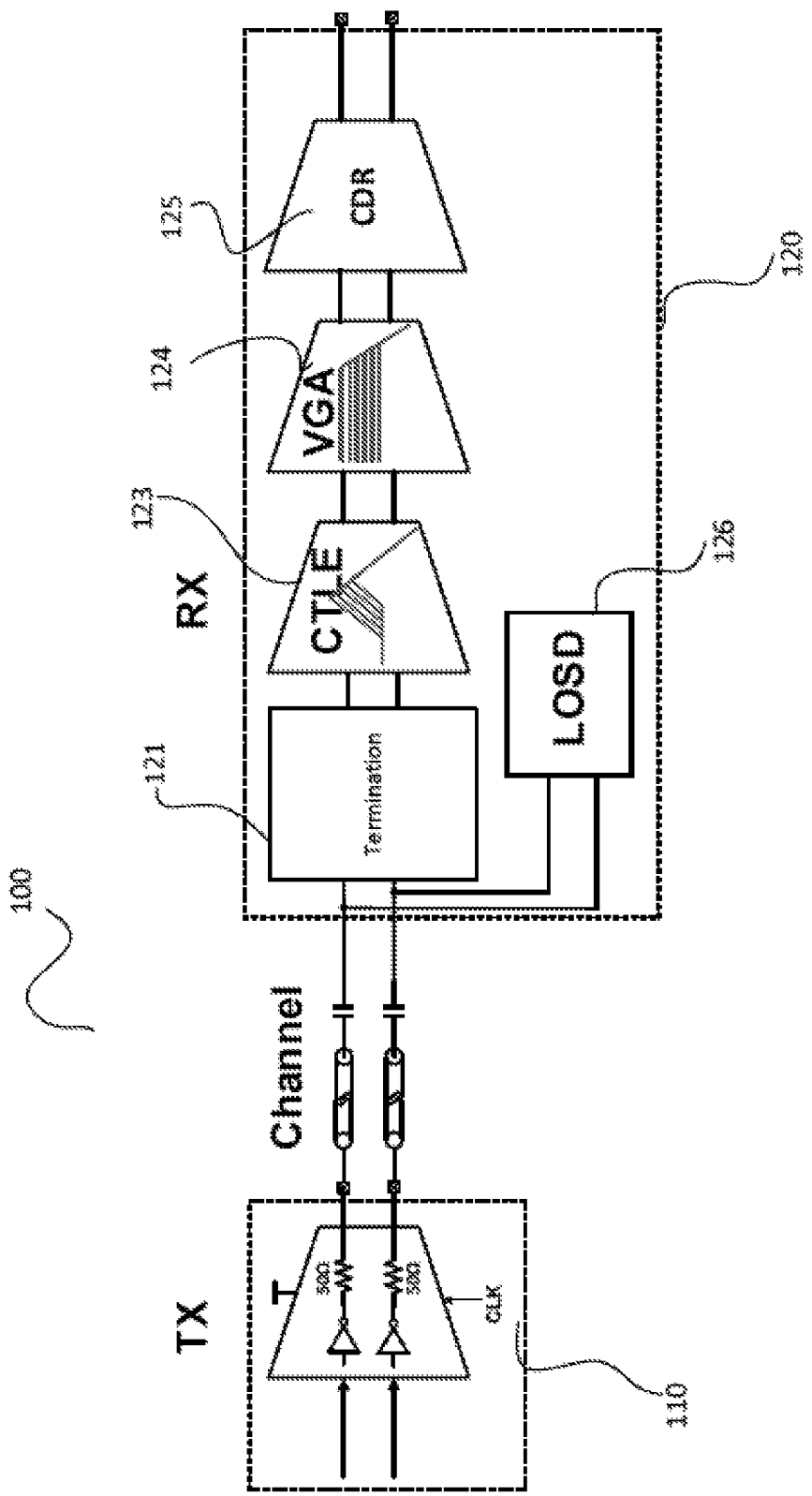
FIG. 1 is a simplified diagram illustrating a communication system according to embodiments of the present invention.

The present invention is directed to communication systems and electrical circuits. According to an embodiment, the present invention provides a termination circuit that includes an inductor network. The inductor network is coupled to a termination resistor and a capacitor network, which includes a first capacitor and a second capacitor. The termination resistor, the first capacitor, and the second capacitor are adjustable, and they affect attenuation of the termination circuit. There are other embodiments as well.

Termination circuits have a wide range of applications. For example, a termination circuit may be implemented as a part of the input terminal of a receiver device, as used in communication systems. Certain characteristics, such as wide band matching and enhanced bandwidth, are highly desirable in high speed serial links and many other applications. For example, if the magnitude range of the input signal is too large, the input signal needs to be attenuated to an acceptable level before feeding into the subsequent stages. It is to be appreciated that embodiments of the present invention provides a termination circuit configuration, which utilizes, among other components, T-coils and adjustable capacitors that affords impedance matching and high bandwidth; a T-coil based termination circuit according to embodiments of the present invention can theoretically provide $-\infty$ dB return loss up to $\infty$ frequency, and the T-coils enhance the bandwidth of termination resistance R (with parasitic resistance C) by a function of $\sqrt{2}$. Additionally, termination circuits according to the present invention provide attenuation adjustment, which is—necessary in certain scenarios—usually more efficient than a variable gain amplifier providing gain adjustment. In various embodiments, termination circuits are implemented with AC coupling of the communication link.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram illustrating a communication system according to embodiments of the present invention. This diagram is merely an example, which should not unduly limit the scope of the claims. One of ordinary skill in the art would recognize many variations, alternatives, and modifications. For example, input termination block 121 is implemented as a part of receiver section 120. In certain embodiments, receiver section 120 as shown is referred to as an analog front end (AFE) section of a receiver. For example, the receiver can be a serializer-deserializer (SerDes) receiver.

Transmitting entity 110 sends data signal, in analog form, to receiver section 120 via communication channels as shown. The incoming signal (from the perspective of receiver section 120) is first processed by the input termination block. Input termination block 121 keeps the input impedance of the receiver close to a predetermined value (e.g., about 50Ω in certain implementations) across a target frequency range (e.g., frequency range used in data transmission) to minimize the reflections. Additionally, input termination block 121 provides signal attenuation to handle a wide range of channels. For example, if the channel is clean and short (e.g., small signal attenuation attributed to channel loss), signal amplitude at the input termination block 121 could be undesirably high and compromise linearity of receiver section 120. By providing attenuation when needed, input termination block 121 helps maintain linearity of receiver section 120. As described below, attenuation by input termination block 121 may can be changed by adjusting a termination capacitance network and/or a termination resistor. In addition to attenuation, termination block 121 can also provide impedance matching bandwidth extension.

It is to be noted that the exemplary receiver section 120 also includes a continuous time linear equalizer (CTLE) block 123, variable-gain amplifier (VGA) block 124, lost of signal detection (LOSD) block 126, and clock data recovery (CDR) block 125. It is to be understood that receiver section 120 can be implemented in other ways as well, such as having different functional blocks with other arrangements.

For various applications involving data communication, it is desirable to adjust the gain attenuation. For example, gain attenuation of the termination block 121 is implemented with programmable gain attenuation (PGA) according to embodiments of the invention. More specifically, incoming signal received by the termination block 121 is usually not controlled, and the signal swing can vary from 200 mV to 1.2V in certain scenarios. For receiver section 120 to properly process incoming signals, the incoming signal needs to be adjusted to be within a predetermined range. For example, the attenuation of the incoming signal can be provided by both the termination block 121, CTLE block 123, and/or the VGA block 124. It is to be appreciated that for large swing of the incoming signal, VGA 124 would be difficult to implement using CMOS circuits. Among other things, large swing range of incoming signal is difficult to attenuate and can degrade linearity. Additionally, certain VGA implementations can lead to undesirable power consumption. As an example, output of VGA 124 is coupled to CDR block 125 as shown.

An important aspect of termination block 121 is to provide bandwidth input matching and attenuation adjustment. As an example, for backplane communication links and related applications, poorly matched termination circuit can lead to signal reflection. For example, if a signal passes through a low-loss channel, it typically has a relatively higher (compared to high-loss channel) frequency component. Well-implemented input matching can reduce reflection issue across a wide bandwidth, especially regarding the high-frequency components.

By improving the performance of termination block 121, the workload of VGA 124 is reduced. In various embodiments, good implementation of termination block 121 can also reduce the workload of CTLE block 123. High-peaking CTLE is often hard to design, and CTLE often requires more power and device area. By shifting workload from CTLE to termination block 121, the system performance can be improved, and the system cost can be reduced.

Figure 2:
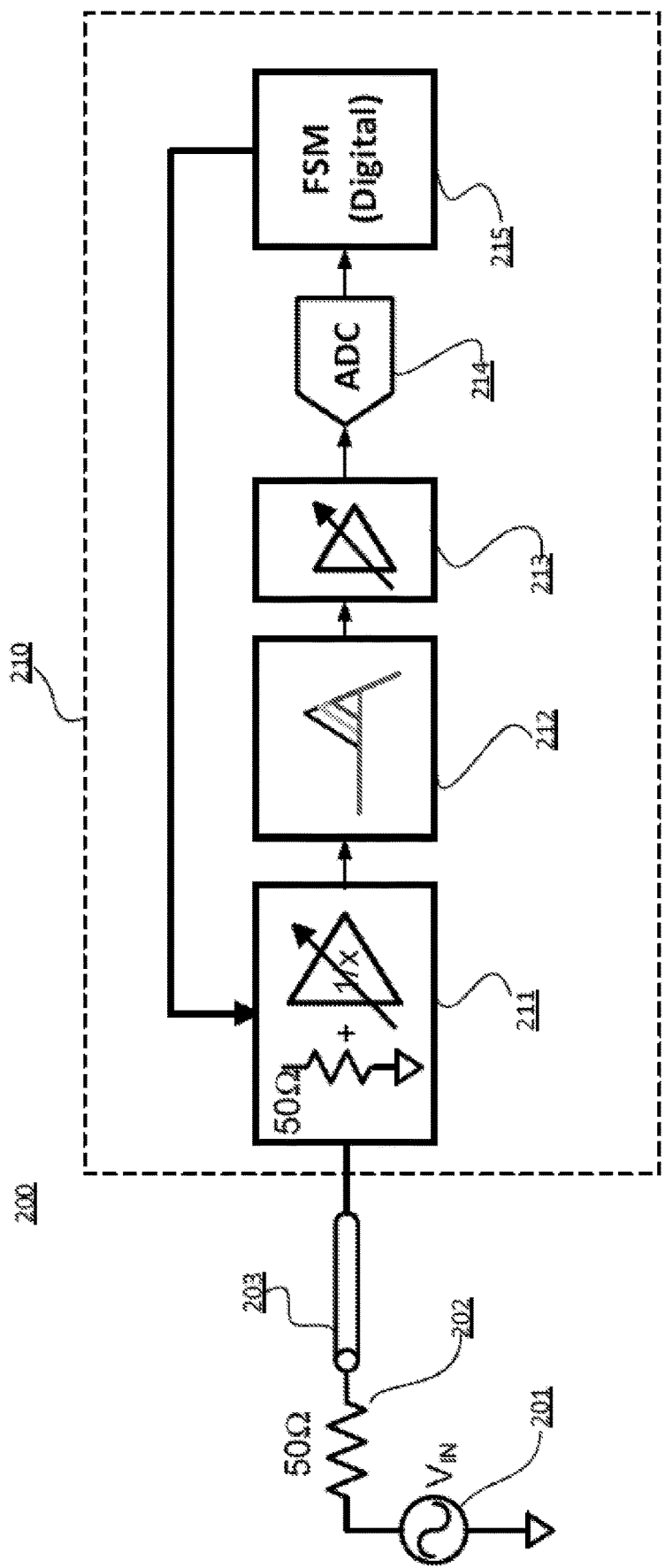
FIG. 2 is a simplified block diagram illustrating operation of a termination circuit in conjunction with other components according to embodiments of the present invention.

FIG. 2 is a simplified block diagram illustrating operation of a termination circuit in conjunction with other components according to embodiments of the present invention. This diagram is merely an example, which should not unduly limit the scope of the claims. One of ordinary skill in the art would recognize many variations, alternatives, and modifications. As shown in FIG. 2, receiver device 210 is coupled to communication channel 203, which is coupled to a transmitter (not shown). As an example, the relevant behavior of the transmitter is modeled by resistor 202 and voltage source 201.

Figure 3:
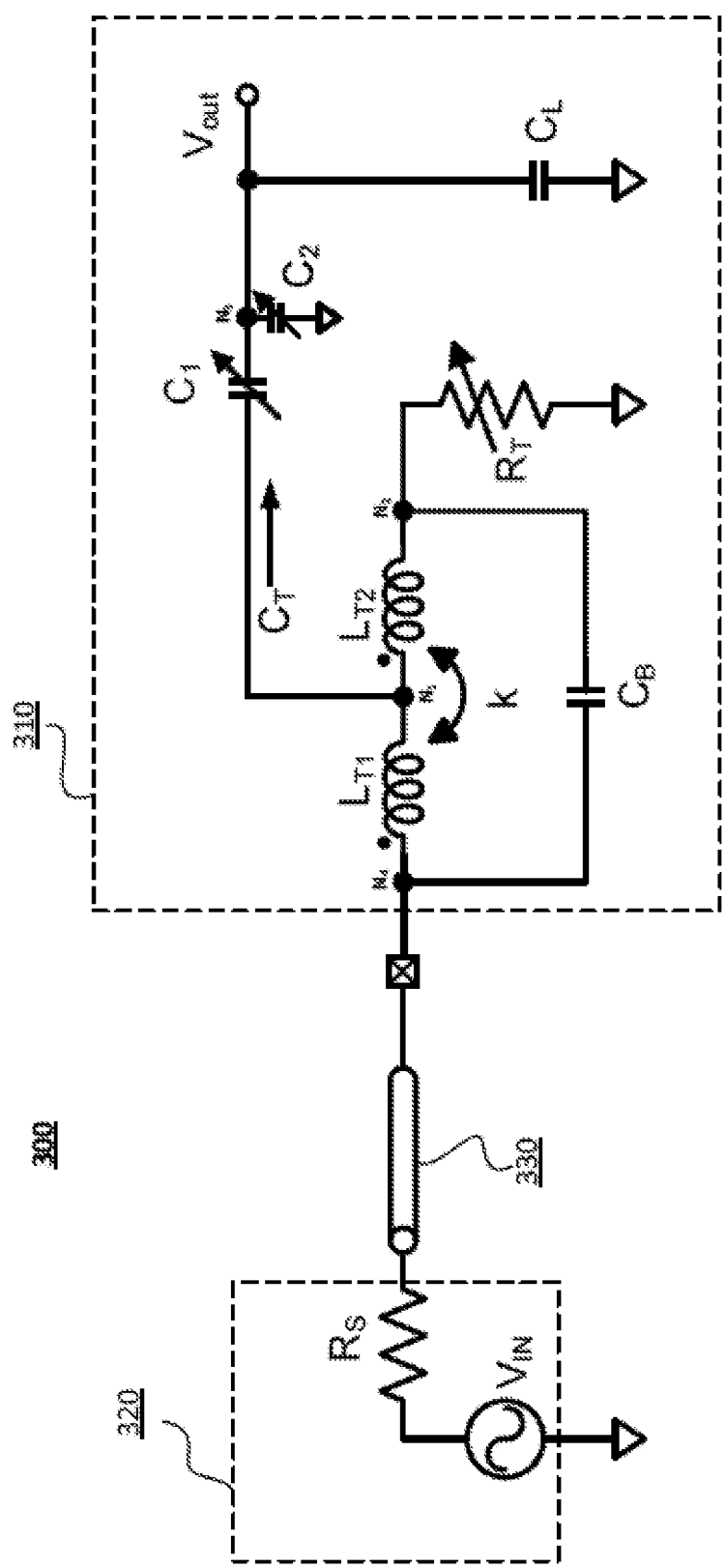
FIG. 3 is a simplified diagram illustrating a termination circuit according to embodiments of the present invention.

Receiver device 210 includes termination circuit 211, which includes an inductor network and a capacitor network. An exemplary embodiment of termination circuit 211 is illustrated in FIG. 3. For example, the inductor network is coupled to an input terminal, which is coupled to communication channel 203. The capacitor network is coupled to the inductor network and an intermediate output terminal. The capacitor network includes a first variable capacitor and a second variable capacitor. For example, a first capacitance of the first variable capacitor is based on a first control signal, and second capacitance of the second variable capacitor is based on a second control signal. Terminal control circuit 211 additionally includes a terminal resistor coupled to the inductor network. For example, the terminal resistor matches resistance value of resistor 202. The resistance of the terminal resistor is adjustable and controlled by a third control signal. Termination circuit 211 is configured to generate an intermediate signal characterized by an attenuation factor, which is based on at least the first capacitance, the second capacitance, and the terminal resistance. As explained above, a termination circuit can provide large attenuation adjustments more efficiently than a VGA. As shown in FIG. 2, termination circuit 211 is coupled to control module 215, which generates control signals (e.g., the first control signal, the second control signal, the third control signal, etc.).

The output of the terminal circuit, the intermediate signal, is provided to equalizer 212. For example, equalizer 212 is configured to generate an equalized signal using the intermediate signal. In various embodiments, equalizer 212 comprises a continuous time linear equalizer (CTLE). The equalized signal, as provided by equalizer 212, is processed by amplifier 213. For example, amplifier 213 comprises a VGA that amplifies the equalized signal to a predetermined level. As explained above, VGA is typically power hungry and inefficient compared to the termination circuit for adjusting amplitude of input data signal. For example, amplifier 213 output a data signal that is characterized by an amplitude suitable for processing by analog-to-digital converter (ADC) 214, configured to generate at least a digital control signal. The ADC 214 generates, among other things, an ADC code that is used by the control module 215. For example, control module 215 is a part of a feedback loop where the attenuation associated with the output of termination circuit 211 affects the ADC code (generated by ADC 214) that is used by control module 215 to generate control signals (e.g., the first control signal, the second control signal, the third control signal, etc.).

FIG. 3 is a simplified diagram illustrating a termination circuit according to embodiments of the present invention. This diagram is merely an example, which should not unduly limit the scope of the claims. One of ordinary skill in the art would recognize many variations, alternatives, and modifications. Terminal circuit 300, as a part of a receiver in communication system 300, is coupled to a transmitter via communication channel 330. For example, behavior and characteristics of the transmitter are characterized by circuit model 320, which includes a source resistor $R_S$ and an input voltage $V_{IN}$. For example, $R_S$ is about 50 ohms, and frequency and amplitude of voltage $V_{IN}$ are both important characteristics of communication signals from the transmitter.

Termination circuit 310 includes an input terminal for receiving an input signal. For example, the input terminal is configured at node $N_4$. An inductor network (or referred to as T-coil) is configured between node $N_4$ and node $N_2$. For example, the inductor network includes inductors $L_{T1}$ and $L_{T2}$, which are coupled with a coupling factor k. In various embodiments, inductors $L_{T1}$ and $L_{T2}$ are a matched pair. For example, the inductor network may be referred to as an abovementioned T-coil. Capacitor $C_B$ is configured in parallel relative to the inductor as shown (i.e., coupled to node $N_4$ and node $N_2$). Resistor $R_T$ (e.g., termination resistor) is coupled to the inductor network at node $N_2$. For example, resistor $R_T$ is a variable resistor, which can be implemented in many ways (e.g., transistor-based), is coupled to a control signal. In various embodiments, resistor $R_T$ is adjusted for the purpose of modifying impedance characteristics and/or adjusting attenuation of termination circuit 310. In various embodiments, resistor $R_T$ is configured at 50 ohms at the DC (i.e., zero frequency) to match resistor $R_S$.

A capacitor network, which include capacitors $C_1$ and $C_2$, is coupled to the inductor network via node $N_1$ as shown. Additionally, the capacitor network is coupled to output terminal Vout at node $N_3$. For example, signal at output terminal Vout is attenuated at a predetermined level, and the attenuation is based on capacitors $C_1$ and $C_2$. In various embodiments, capacitors $C_1$ and $C_2$ are implemented using variable capacitors. For example, capacitors $C_1$ and $C_2$ each receives its respective control signal from the control module. As explained below, control module generates control signals—for the purpose of adjusting attenuation—for resistor $R_T$ and capacitors $C_1$ and $C_2$. Capacitor $C_L$ is coupled to output terminal Vout the capacitor network via node $N_3$. As illustrated in FIG. 2, a control module generates these control signals in a feedback loop (i.e., codewords received form the ADC is based on, among other things, attenuation provided by the termination circuit).

In various embodiments, the control module uses a predetermined algorithm (and/or a lookup table) to generate control signals to satisfy the equations below.

To provide impedance matching, resistor $R_T$ matches resistor $R_S$, as described in Equation 1 below:

$$R_S:R_T=R_S.$$  Equation 1:

The requirement for T-Coil for matching and bandwidth extension is expressed in the following equations:

$$L_T=C_T R^2_T/(2(1+k))$$  Equation 2:

$$C_B=0.25*C_T*(1-k)/(1+k)$$  Equation 3:

$$C_1=C_T/(1-\alpha)$$  Equation 4:

$$C_2=C_T(1-\alpha)/\alpha$$  Equation 5:

In a zero-dB scenario, $C_1$ is configured to be much greater than $C_L$, and $C_2$ is disconnected. In various embodiments, programmability can be implemented using discrete values of capacitances and switches. For example, the control module may be configured to execute algorithms to generate control signals that satisfy Equations 1-5. In various embodiment, a lookup table (LUT) containing predetermined value set satisfying Equations 1-5 is used to generate control signals for the termination circuit.

Figure 4:
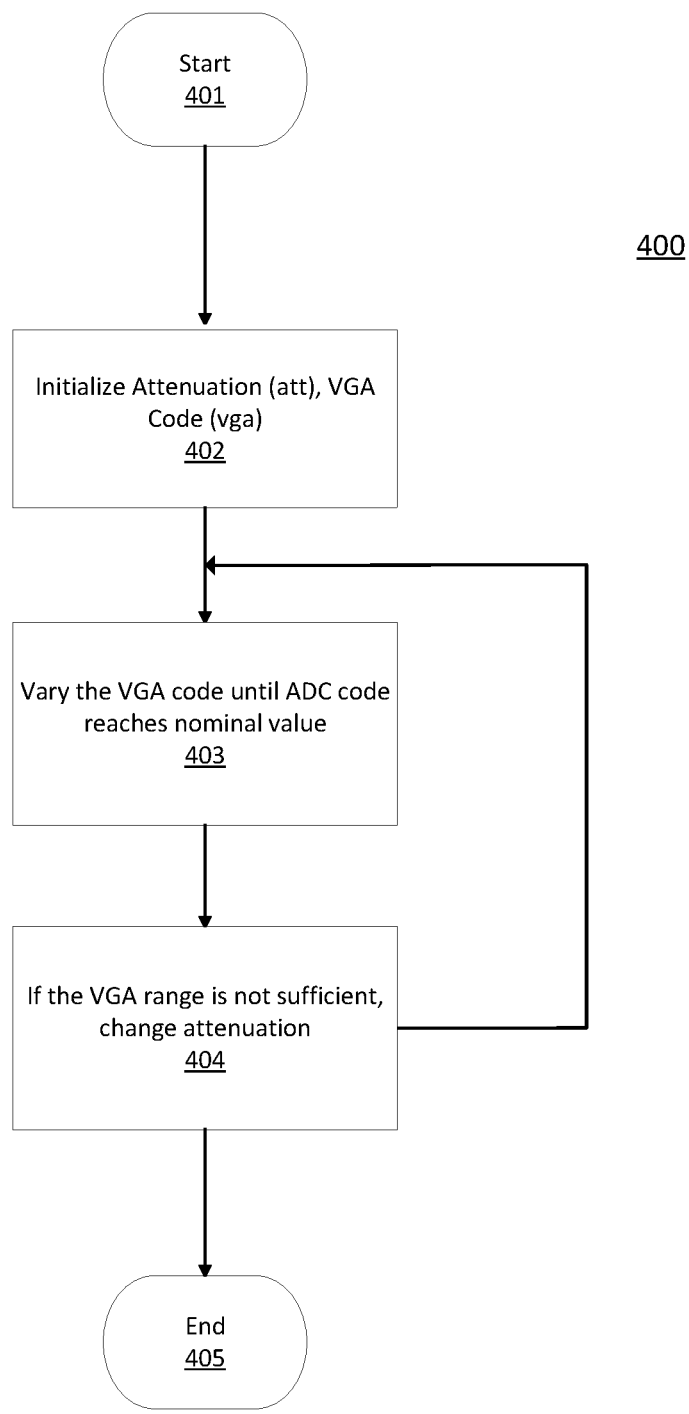
FIG. 4 is a simplified flow diagram illustrating a control module controlling the operation of a termination circuit according to embodiments of the present invention.

FIG. 4 is a simplified flow diagram illustrating operation of a termination circuit according to embodiments of the present invention. This diagram is merely an example, which should not unduly limit the scope of the claims. One of ordinary skill in the art would recognize many variations, alternatives, and modifications. For example, one or more steps illustrated in FIG. 4 can be added, removed, repeated, replaced, overlapped, rearranged, and/or modified, which should not unduly limit the scope of claims. In various embodiments, operation of the termination circuit is controlled by a control module (e.g., as illustrated in FIG. 2).

For example, the control module executes an algorithm based on the flow diagram 400 to generate control signals for the termination circuit. The process starts at step 401. For example, the process may start when the receiver turns and initializes. At step 402, various parameters such as attenuation level and VGA code are initialized. For example, attenuation level is associated with the termination circuit, and the VGA code is associated with the amplifier gain level (e.g., the VGA uses a control signal from the control module to adjust its gain level). At explained above, the attenuation adjustment at the termination circuit can provide a higher latitude than the gain adjustment at the VGA. At step 403, the control module generates a control signal that varies the VGA code (i.e., adjust VGA gain) until a predetermined threshold or nominal value is reached. However, the VGA might not have enough gain range to reach predetermined threshold. At step 404, control module changes (e.g., at a predetermined step size, which is presumably greater than the VGA gain range) the attenuation of the termination circuit and goes back to step 403 as shown. The adjustment process continues until the ADC code (and/or other metrics) reaches the predetermined nominal value, and the process ends at step 405.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A termination circuit for receiving a signal from a communication channel, the termination circuit comprising:
   an inductor network including first and second inductors connected to each other in series to a node, the inductor network configured to receive the signal from the communication channel;
   a capacitor network comprising a plurality of capacitors connected to the inductor network, one or more of the plurality of capacitors being configured to provide a variable capacitance, a first variable capacitor of the capacitor network with a first end directly connected to the node and a second end directly connected to an output of the termination circuit;
   a termination resistor connected to the inductor network and ground, the termination resistor being configured to provide variable resistance and to adjust an impedance characteristic of the termination circuit; and
   circuitry configured to output one or more control signals to at least one of the capacitor network and the termination resistor to vary at least one of the termination resistor and the one or more of the plurality of capacitors to adjust a parameter of the signal received from the communication channel.

2. The termination circuit of claim 1 wherein the parameter includes amplitude and wherein adjusting the parameter includes attenuating the amplitude of the signal.

3. The termination circuit of claim 2 wherein adjusting the parameter includes attenuating the amplitude by an attenuation factor, the circuitry varying the at least one of the termination resistor and the one or more of the plurality of capacitors based on the attenuation factor.

4. The termination circuit of claim 2 wherein adjusting the parameter includes attenuating the amplitude to a predetermined level by the circuitry by varying the at least one of the termination resistor and the one or more of the plurality of capacitors to reduce reflection of the signal across a bandwidth of the communication channel.

5. The termination circuit of claim 1 wherein the circuitry is configured to adjust the parameter of the signal received from the communication channel in response to the communication channel being a low-loss communication channel.

6. The termination circuit of claim 1 wherein the circuitry comprises an analog to digital converter configured to generate a digital code based on an output of the capacitor network, wherein the circuitry is configured to generate the one or more control signals to adjust the parameter by varying the at least one of the termination resistor and the one or more of the plurality of capacitors based on the digital code.

7. The termination circuit of claim 1 wherein:
the plurality of capacitors includes a pair of capacitors connected across the output of the termination circuit and ground; and
one capacitor in the pair of capacitors is a variable capacitor.

8. The termination circuit of claim 1 wherein:
the first inductor receives the signal from the communication channel; and
the termination resistor is connected to the second inductor.

9. The termination circuit of claim 1 further comprising a second capacitor connected across the first and second inductors.

10. A receiver comprising the termination circuit of claim 1 wherein the termination circuit is configured to increase a linearity of the receiver across a target frequency range by adjusting the parameter of the signal.

11. A receiver comprising:
the termination circuit of claim 1; and
a signal processing circuit coupled to an output of the capacitor network of the termination circuit, the output being attenuated by the termination circuit due to the adjusted parameter of the signal, the signal processing circuit being configured to process the output with reduced amount of power and device area due to an attenuation of the output by the termination circuit as compared to an amount of power and device area required without the attenuation.

12. The receiver of claim 11 wherein:
wherein the circuitry is configured to adjust a gain of the signal processing circuit; and
wherein an amount of the gain adjustment is inversely proportional to an amount of the adjustment of the parameter of the signal.

13. The termination circuit of claim 1 wherein the plurality of inductors includes a pair of inductors that are coupled to each other to form a matched pair of inductors.

14. A receiver comprising:
the termination circuit of claim 1;
an equalizer configured to equalize a signal output by the termination circuit with the adjusted parameter;
a variable gain amplifier configured to amplify an equalized signal output by the equalizer; and
an analog to digital converter configured to convert an amplified analog signal output by the variable gain amplifier to a digital signal,
wherein the circuitry is configured to generate the one or more control signals based on the digital signal output by the analog to digital converter.

15. The receiver of claim 14 wherein the circuitry is configured to improve at least one of the following design parameters of the receiver:
a bandwidth of the receiver by increasing a linearity of the receiver across a target frequency range by adjusting the parameter of the signal;
by reducing power consumption and device area of the equalizer by adjusting the parameter of the signal as compared to an amount of power and device area required without the adjustment of the parameter of the signal; and
by reducing power consumption and gain of the variable gain amplifier by adjusting the parameter of the signal as compared to the amount of power and gain required without the adjustment of the parameter of the signal.

* * * * *